CIRCUIT FOR MINIMIZING THE SIGNAL CURRENTS DRAWN BY THE INPUT STAGE OF AN AMPLIFIER

Filed Feb. 11, 1972

3,717,821

CIRCUIT FOR MINIMIZING THE SIGNAL CURRENTS DRAWN BY THE INPUT STAGE OF AN AMPLIFIER

Hiroshi Amemiya, Morrisville, Pa., and Stefano Arturo Graf, Somerville, N.J., assignors to RCA Corporation
Filed Feb. 11, 1972, Ser. No. 225,498
Int. Cl. H03f 1/08
U.S. Cl. 330—26 9 Claims

ABSTRACT OF THE DISCLOSURE

A circuit for reducing the signal current flowing into the base of a bipolar input transistor and which dissipates relatively little power. The collector current of the input transistor is passed through the collector-to-emitter path of a second transistor. A current mirror, comprising a third transistor connected at its collector to the base of the second transistor and a fourth transistor connected at its collector to the input transistor, conducts the base current of the second transistor and in response thereto causes an approximately equal current to flow to the base of the input transistor.

BACKGROUND OF THE INVENTION

Bipolar transistors, when operated in the common base or common emitter mode, have a low input impedance. Even when operated in the common collector mode, bipolar transistors have a relatively low input impedance. As a result, substantial signal current is normally drawn from the signal source driving a bipolar transistor. This loads down the signal source and attenuates the voltage amplitude of the signal.

One solution to the problem above is illustrated in the prior art circuit of FIG. 1. The bias current to the base of input transistor T3 is supplied by the base current of transistor T1 and little current is drawn from the signal source for the reasons discussed below. Assume, for example, that the input signal increases. In response thereto, the collector current of transistor T3 increases causing an increase in the base and collector currents of transistor T4. The base currents of transistors T4 and T2 are identical. Therefore, the collector current of transistor T2 increases and hence the emitter and base currents of transistor T1 are increased.

If transistors T1 and T2 have substantially the same operating characteristics, their base currents ($i_1$ and $i_2$) are approximately equal to the base currents into transistors T3 and T4 are approximately equal. The increased base current ($i_1$) to transistor T3 effectively cancels any increase in the signal current from the signal source. Thus for an increasing signal, the bias current is increased but little or no additional current is drawn from the signal source. The AC input impedance of the circuit, as seen by the signal source, is therefore, greatly increased.

While the circuit of FIG. 1 does solve the problem of signal attenuation, in some applications, it is also important that power dissipation be minimized. In battery operated circuits, saving of power means increased battery life. In integrated circuits, reduced power consumption reduces the temperature of the "chip." This permits the circuit elements to be placed closer together (permits higher packing density), or, for a given packing density, lowers the circuit failure rate.

The circuit of FIG. 1 suffers in this respect. The base currents ($i_1$, $i_2$) of transistors, T1, T2, provide the base currents to transistors T3 and T4. However, the collector current of transistors T1 and T2 which is equal to their base current multiplied by the forward current gain ($i_c = \beta i_b$) is dissipated (constitutes a power loss). Since the forward current gain may range from 5 to 1000, the prior art circuit may produce a considerable waste of power.

SUMMARY OF THE INVENTION

Means for sensing the collector current of an input transistor and means responsive to the current sensed for supplying the necessary base current to said transistor to maintain the collector current at substantially the same level. The sensing means includes the collector-to-emitter path of a second transistor in series with the collector-to-emitter path of said first transistor. The responsive means includes third and fourth transistors connected base-to-base and connected at their collectors to the bases of said second and input transistors, respectively.

DETAILED DESCRIPTION OF THE INVENTION

Figure 1:
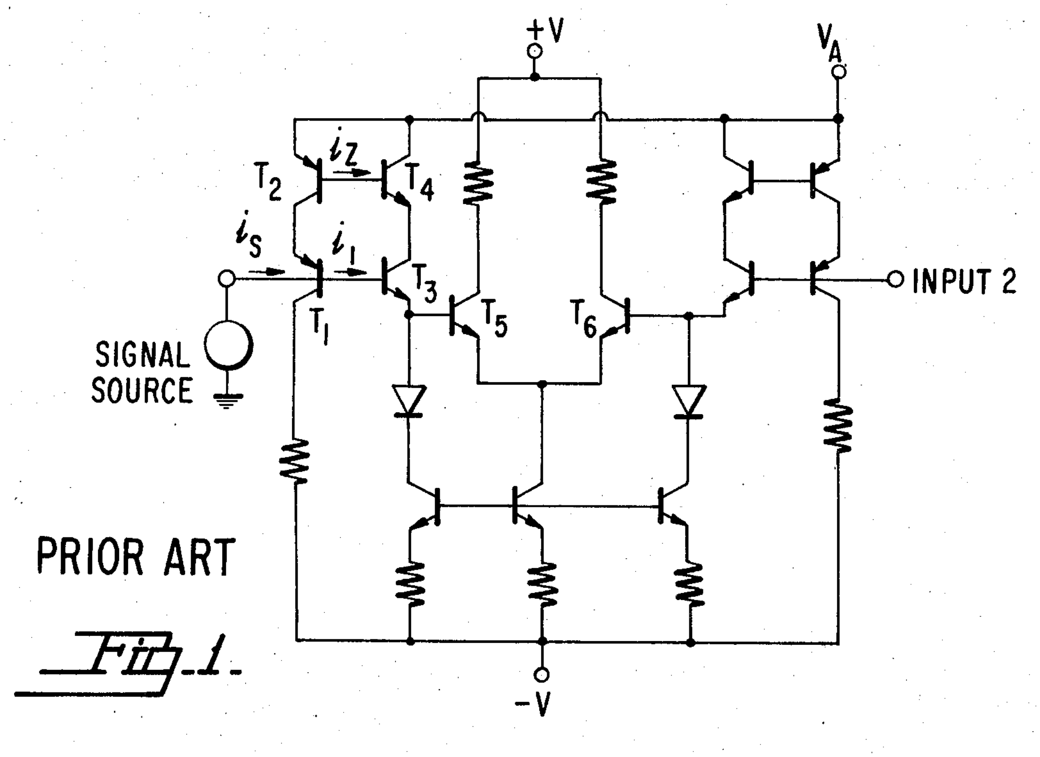
FIG. 1 is a schematic drawing of a prior art circuit.
Figures 2, 3:
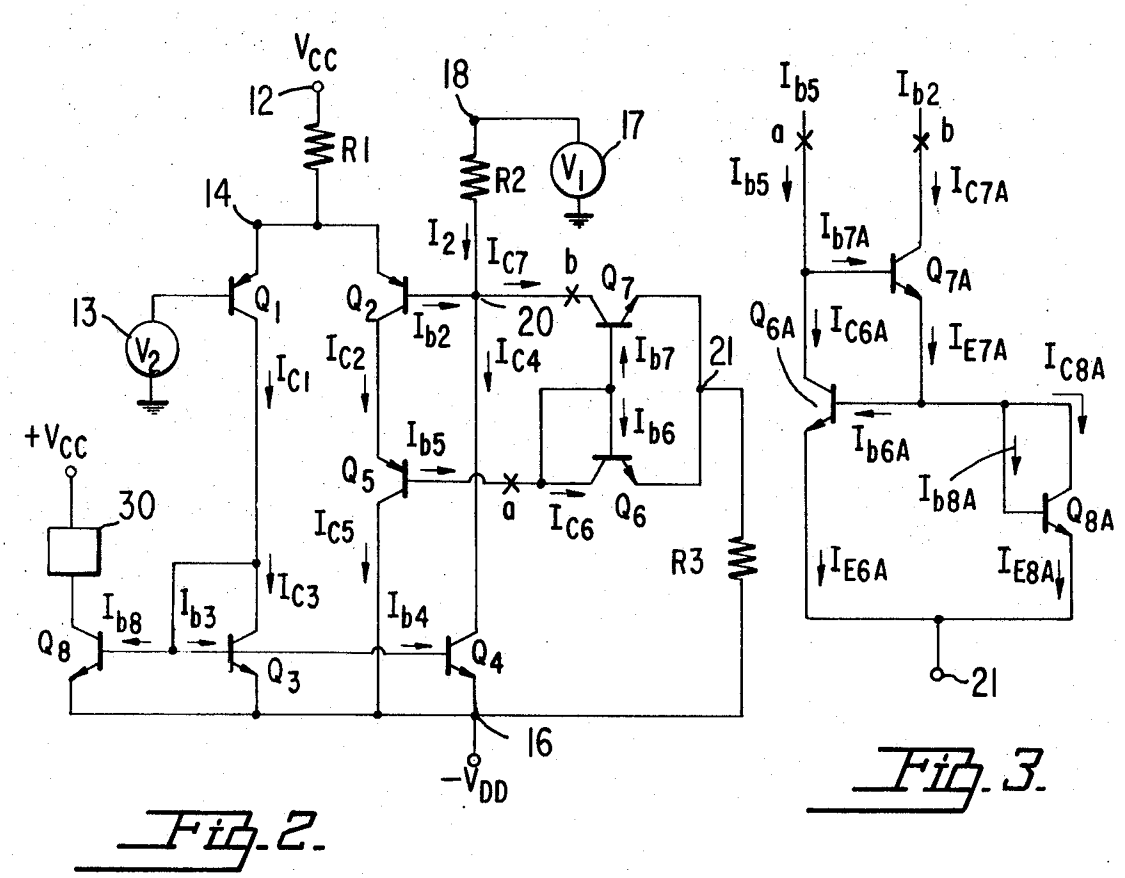
FIG. 2 is a schematic diagram of a circuit embodying the invention.
FIG. 3 is a schematic diagram of a portion of another circuit embodying the invention.

The circuit of FIG. 2 includes eight bipolar transistors, Q1 through Q8. PNP bipolar transistors Q1 and Q2, which comprise a differential amplifier, are connected at their emitters through resistor R1 to terminal 12 for a source of positive operating potential $+V_{CC}$. A source of reference potential 13 of amplitude $V_2$ is connected to terminal 14 at the base of transistor Q1. Transistor Q1 is connected at its collector to the collector and base of transistor Q3 and to the bases of current source transistors Q4 and Q8. The emitters of NPN bipolar transistors Q3, Q4, and Q8 are connected in common to terminal 16. A source of negative operating potential of amplitude $-V_{DD}$ is applied to terminal 16. PNP transistor Q5 is connected at its emitter to the collector of transistor Q2 and at its collector to terminal 16.

Transistor Q5 is connected at its base to the collector and base of transistor Q6 and to the base of transistor Q7. Transistors Q4 and Q7 are connected at their collectors to node 20 and transistor Q2 is connected at its base to node 20. The emitters of transistors Q6 and Q7 are connected to node 21. Current limiting resistor R3 is connected between terminals 16 and 21.

A signal source 17 of amplitude $V_1$ is connected to terminal 18 and resistor R2 is connected between terminal 18 and node 20. The collector of transistor Q8 is returned through output load device 30 to terminal 12. As discussed below, it is desirable that the collector current of transistor Q8 be an exact ratio of the current ($I_2$) flowing through resistor R2.

The operation of the circuit may best be explained by assuming the following typical values: $V_{CC}$ is +5 volts, $V_{DD}$ is −15 volts, $V_2$ is −4.3 volts, and $V_1$ is +1.4 volts (i.e., $V_1$ is more positive than $V_2$). The forward current gain ($\beta$) of the NPN transistors is denoted by $\beta_N$ and is of the order of 100 to 500. The $\beta$ of the PNP transistors is denoted by $\beta_P$. In integrated circuits, the PNP transistors Q1, Q2, and Q5 are formed as lateral type transistors. As is well known, lateral transistors have a relatively low $\beta$ (e.g., 5 to 50). (This is an additional reason why the input impedance, especially of PNP transistors, must be increased.)

Currents $I_{C1}$ and $I_{C2}$ are produced at the collectors of transistors Q1 and Q2, respectively. $I_{C1}$ supplies the base currents of transistors Q3, Q4, and Q8 and the collector current of transistor Q3.

The current ($I_{b4}$) into the base of transistor Q4 causes a collector current ($I_{C4}$) to flow. Due to the negative feedback arrangement of transistors Q1, Q3, and Q4, the steady state value of $I_{C4}$ is reached when the potential at the base of transistor Q2 (node 20) equals the potential ($V_2$) applied to the base of transistor Q1. The signal current ($I_2$) through resistor $R_2$ is then equal to the difference of $V_1$ minus $V_2$ divided by $R_2$.

Assuming transistors Q3 and Q4 to be equal area devices, their emitter currents will be equal. Since their base currents are substantially equal (both supplied from transistor Q1) their collector currents are also substantially equal. Therefore, $I_{C4}$ is substantially equal to $I_{C3}$. Since the forward current gain ($\beta$) of NPN bipolar transistors is relatively high (100 or more) the base currents of these transistors may, to a first approximation, be neglected. Thus, $I_{C4}$ is approximately equal to $I_{C1}$; ($I_{C4} \approx I_{C1}$).

With a potential of $V_2$ present at its base (due to the negative feedback), transistor Q2 conducts. Its base current ($I_{b2}$) (neglecting the $V_{BE}$ drop) is directly proportional to the potential difference between $V_{CC}$ and $V_2$ and inversely proportional to the product of the forward current ratio ($\beta_P$) and the ohmic value of resistor R1.

$$\left[I_{b2} \cong K_A \frac{V_{CC}-V_2}{2(\beta_p)(R_1)}\right]$$

That portion of $I_{b2}$ which flows in the collector of transistor Q7 does not mix with the signal current $I_2$ and hence does not flow in the signal path defined by the signal source 17, resistor R2 and the collector-to-emitter path of transistor Q4. It remains to be shown that $I_{b2}$ is supplied primarily by the feedback loop comprising transistor Q5 and the current mirror comprising transistors Q6 and Q7. As a result, the base current of the input transistor is, to a large extent, independent of the signal current. This increases the AC input impedance of transistor Q2 considerably and correspondingly decreases the loading effect on the signal source.

Concurrent with the flow of $I_{b2}$, transistor Q2 produces a collector current $I_{C2}$, ($I_{C2}=\beta_P \times I_{b2}$), which supplies the emitter current ($I_{E5}$) of transistor Q5. $I_{C2}$ is equal to $I_{E5}$. Assuming transistors Q2 and Q5 to have equal forward current gains, their base currents, $I_{b2}$ and $I_{b5}$, respectively, will be approximately equal. (In fact, the emitter current ($I_{E2}$) of transistor $Q_2$ is slightly greater than $I_{E5}$ since $I_{E2}=I_{E5}+I_{b2}$. Therefore, $I_{b2}$ is slightly greater than $I_{b5}$).

$I_{E5}$ is equal to $I_{b5}$ plus $I_{C5}$. $I_{b5}$ flows into the bases of transistors Q6 and Q7 and also supplies the collector current $I_{C6}$ of transistor Q6; ($I_{b5}=I_{C6}+I_{b6}+I_{b7}$). Assuming current mirror transistors Q6 and Q7 to be equal area devices, their emitter currents will be equal. Since the emitter currents of transistors Q6 and Q7 are equal, and since their base currents and their $\beta$'s are presumed equal, their collector currents, $I_{C6}$ and $I_{C7}$, respectively, will be substantially equal; ($I_{C6}=I_{C7}$).

$I_{b5}$ may be expressed as: $I_{b5}=I_{b6}(\beta_N+2)=I_{b7}(\beta_N+2)$. $I_{C7}$ which is induced by $I_{b5}$ is equal to $\beta_N I_{b7}$ and is less than $I_{b5}$ by the base currents $I_{b6}$ and $I_{b7}$ flowing into transistors Q6 and Q7. $I_{C7}$ is drawn from node 20. The base current $I_{b2}$ of the input transistor Q2 flows into node 20 and a portion of $I_{b2}$, equal in amplitude to $I_{C7}$, supplies the collector current of transistor Q7.

The effect of current $I_{C7}$ fed back to the base of input transistor Q2 may be viewed in many equivalent ways. In one sense, the feedback or bias current ($I_{C7}$) cancels an equal amount of current from being drawn or supplied by signal source. In this respect, the technique is a current cancelling technique. That is, both the AC and DC components of the signal current are cancelled. Alternatively, the circuit may be viewed as increasing the input impedance of the input transistor.

The AC input impedance ($Z_{IN}$) of the amplifier seen by the signal source is proportional to the variation in the potential applied at the base of input transistor Q2 and inversely proportional to the variation in base current drawn from (or supplied to) the transistor by the signal source due to variations in input voltage. This may be expressed mathematically as:

$$Z_{IN}=\frac{dV}{dI_S} \cong \frac{\Delta V_{20}}{\Delta[I_{b2}-I_{C7}]} \quad (1)$$

where $dV$ is the potential change developed at node 20 and $dI_S$ is the change in $I_S$ where $I_S$ equals $I_{b2}-I_{C7}$.

Ideally, if $I_{C7}$ were equal to $I_{b2}$ (which would require $I_{b2}$ to equal $I_{b5}$ and the current mirror action to be perfect) all of $I_{b2}$ would flow into the collector of Q7 and the input impedance looking into the base of transistor Q2 would be infinite. Then, $I_{C4}$ would be identical to $I_2$ and there would be no loading effect by the amplifier on the signal.

However, $I_{b2}$ is slightly greater than $I_{b5}$ and, in addition, $I_{b2}$ exceeds $I_{C7}$ by the base currents ($I_{b6}$ and $I_{b7}$) of transistors $Q_6$ and $Q_7$. Therefore, there is a portion of $I_{b2}$ which flows in the signal path (the collector current of Q4) and which lowers the input impedance of the transistor. Though lowered, the input impedance is considerably increased.

The increase in impedance may be shown by expressing $I_{C7}$ in terms of $I_{b2}$ and expressed as follows:

$$Z_{IN} \cong \frac{k}{I_{b2}\left[1-\frac{\beta_P \times \beta_N}{(\beta_P+1)(\beta_N+2)}\right]} \quad (2)$$

where $k$ is a constant equal to $KT/q$, where K is Boltzman's constant, T is temperature in degrees Kelvin and $q$ is the charge of an electron.

Equation 2 reduces to:

$$Z_{IN} \cong \frac{k}{I_{b2}\left[\frac{2\beta_P+\beta_N+2}{(\beta_P+1)(\beta_N+2}\right]} \quad (3)$$

for values of $\beta_P$ much lower than $\beta_N$ the input impedance is multiplied by $\beta_P$. However, as $\beta_p$ increases and/or is approximately equal to $\beta_N$, the input impedance is increased by a factor of approximately $\beta/3$. As already mentioned, this may also be viewed as a considerable reduction in the current that has to be supplied by the signal source.

Increasing the input impedance of the amplifier minimizes errors in the amplification of the input signal. In the absence of the biasing circuit comprising transistors Q5, Q6, and Q7, the total base current of transistor Q2 flows into the collector of transistor Q4. $I_{C4}$ is then equal to $I_2+I_{b2}$. $I_{C4}$ is also approximately equal to $I_{C1}$ and $I_{C1}$ supplies a current to the base of transistor Q8 for generating a current which is a function of the signal current. However, the base and collector currents of transistor Q8 are then a function of $I_2$ and $I_{b2}$ rather than of $I_2$ above. In contrast in the circuit of FIG. 2 the error component due to $I_{b2}$ is reduced.

In circuits embodying the invention, the collector-to-emitter currents of biasing transistors Q6 and Q7 are obtained from the base currents of transistors Q2 and Q5. The collector currents of transistors Q6 and Q7 are thus not wasted since they conduct the base currents of transistors Q2 and Q5 which in any event have to be returned to a point of reference potential. It is evident that the power dissipation of the instant circuit is considerably less than that of the prior art circuit since the collector current drawn by the prior art biasing circuit is a factor of $\beta_P$ times greater than in the instant circuit.

The circuit arrangement of transistors Q5, Q6, and Q7 provides positive feedback to transistor Q2. That is, the current fed back to the base of transistor Q2 is in the same direction as the causative signal. Normally, as mentioned above $I_{C7}$ is less than $I_{b2}$ which means that though the feedback is positive the current loop gain is less than one. Under such a condition, and in the absence of an input signal, $I_{b2}$ goes to zero. It is also possible to postulate a condition were the loop gain is greater than one. This can occur, for example, if the $\beta$ of transistor Q5 is less than that of transistor Q2. $I_{b5}$ would then be greater than $I_{b2}$ and if $I_{b5}$ is sufficiently greater to induce and $I_{C7}$ which exceeds $I_{b2}$ the loop gain exceeds one and the system is unstable. $I_{b2}$ would then tend to become infinite.

The combination of transistors Q3 and Q4 provides negative feedback betweent he output (collector of transistor Q1) and the input (base of transistor Q2) of the differential amplifier which ensures that the total response of the system is stable in spite of the positive feedback loop gain.

That is, variations in potential at node 20 are reduced by the action of the negative feedback loop. For example, an increase in potential at node 20 causes an increase in $I_{c1}$ which in turn increases $I_{b4}$ which flows through $R_2$ causing the potential at node 20 to decrease until it equals $V_2$. This restores the system to equilibrium.

The circuit of FIG. 2 includes a transistor current mirror for developing the bias current to the input transistor. Other current mirrors such as the one shown in FIG. 3 could be used, instead, to provide greater input impedance with little or no increase in power dissipation. Points *a*, *b*, and 21 of FIG. 3 would be respectively connected to points *a*, *b*, and 21 of FIG. 2. The current mirror of FIG. 3 includes transistors Q6A and Q8A connected emitter-to-emitter to terminal 21 and connected base-to-base to the emitter of transistor Q7A. The collector of transistor Q8A is also connected to the emitter of transistor Q7A. The base of transistor Q7A and the collector of transistor Q6A are connected to the base of transistor Q5 of FIG. 2 for conducting $I_{b5}$. The collector of transistor Q7A is connected to node 20 of FIG. 2 for conducting $I_{b2}$. In the circuit of FIG. 3, the difference between the driving current ($I_{b5}$) and the output current ($I_{C7A}$) is minimized.

$$I_{b5}-I_{C7A}=I_{b5}\left[\frac{2}{(\beta+1)^2+1}\right] \qquad (4)$$

Equation 4 indicates that approximately all of the base current of transistor Q5 is fed back to the base of transistor Q2 further increasing its input impedance and decreasing the loading effect on the signal current.

It should be appreciated that in FIGS. 2 and 3 the PNP transistors could be replaced by NPN transistors and that the NPN transistors could be replaced by PNP transistors. In such case, the base currents are then supplied to the base of the input transistor rather than being drawn therefrom.

What is claimed is:

1. The combination comprising:
an input transistor;
means for applying an input signal to the base of said input transistor thereby changing to a new value the collector current of said transistor;
means including a second transistor for sensing said collector current and for producing at the base of said second transistor a bias current proportional to said collector current; and
third and fourth transistors responsive to said bias current, connected at their collectors to the bases of said second and input transistors, respectively, for supplying a current approximately equal to said bias current to the base of said input transistor, for maintaining the collector current of the input transistor at its new value while drawing minimal signal current.

2. The combination as claimed in claim 1 wherein said third and fourth transistors are connected base-to-base and emitter-to-emitter and said third transistor is connected base-to-collector; and
further including means for coupling said emitters to a point of reference potential.

3. The combination as claimed in claim 2 wherein said input and second transistors are of one conductivity type and wherein said third and fourth transistors are of second conductivity type.

4. The combination as claimed in claim 1 further including an additional transistor connected in circuit with said input transistor for forming a differential amplifier stage;
means for applying a first reference potential to the base of said additional transistor; and
negative feedback means connected between the collector of said additional transistor and the base of said input transistor for setting the potential at the base of the latter equal to said first reference potential.

5. The combination as claimed in claim 4 wherein said negative feedback means includes a current mirror comprising two transistors.

6. The combination comprising:
first and second transistors of one conductivity type having their collector-to-emitter paths connected in series;
means for applying a signal to the base of said first transistor;
third and fourth transistors of second conductivity type;
means for supplying a base current to said first transistor substantially equal in magnitude to the base current of said second transistor including means connecting the base and collector of said third transistor and the base of said fourth transistor to the base of said second transistor;
means connecting the collector of said fourth transistor to the base of said first transistor; and
means for connecting the emitters of said third and fourth transistors in common and for coupling said emitters to a common point of operating potential.

7. The combination as claimed in claim 6 wherein said first and second transistors are PNP lateral bipolar devices and wherein said third and fourth transistors are vertical NPN transistors.

8. In combination:
a bipolar transistor;
means for applying operating current to the emitter-to-collector path of said transistor;
means for applying an input signal to the base of said transistor;
means including a second transistor the emitter to collector path of which is essentially in series with the emitter-to-collector path of the first transistor for sensing the collector current of the first transistor and producing at the base of the second transistor a current proportional to said collector current; and
a positive feedback loop between the base of the second transistor and the base of the first transistor for providing sufficient base current for the first transistor to maintain the collector current at the level at which it is sensed and to thereby reduce to a very low level the signal current flowing into the base of said first transistor, said feedback loop comprising the collector-to-base path of a third transistor in series with the base-to-collector path of a fourth transistor, said third and fourth transistors being connected base-to-base and said third transistor being connected base-to-collector.

9. In the combination as set forth in claim 8 further including means responsive to the current flowing in the emitter-to-collector path of said first transistor for applying a degenerative feedback signal to the base of said first transistor.

References Cited

"Op-Amp ICS with Super-Gain Transistors," EBQ, November 1969, pp. 16, 19, 20, 22, 24.

ROY LAKE, Primary Examiner

J. B. MULLINS, Assistant Examiner

U.S. Cl. X.R.

330—28, 30 D